(12) United States Patent
Leridon et al.

(10) Patent No.: US 11,170,945 B2
(45) Date of Patent: Nov. 9, 2021

(54) SUPERCAPACITOR WITH ELECTROLYTE

(71) Applicants: PARIS SCIENCES ET LETTRES—QUARTIER LATIN, Paris (FR); CENTRE NATIONAL DE LA RECHERCHE SCIENTIFIQUE—CNRS, Paris (FR); UNIVERSITE PIERRE ET MARIE CURIE (PARIS 6), Paris (FR); ECOLE SUPÉRIEURE DE PHYSIQUE ET DE CHIMIE INDUSTRIELLES DE LA VILLE DE PARIS, Paris (FR)

(72) Inventors: Brigitte Leridon, Cachan (FR); Stéphane Hole, Paris (FR); Rémi Federicci, Paris (FR)

(73) Assignees: PARIS SCIENCES ET LETTRES—QUARTIER LATIN, Paris (FR); CENTRE NATIONAL DE LA RECHERCHE SCIENTIFIQUE—CNRS, Paris (FR); UNIVERSITE PIERRE ET MARIE CURIE (PARIS 6), Paris (FR); ECOLE SUPÉRIEURE DE PHYSIQUE ET DE CHIME INDUSTRIELLES DE LA VILLE DE, Paris (FR)

( * ) Notice: Subject to any disclaimer, the term of this patent is extended or adjusted under 35 U.S.C. 154(b) by 0 days.

(21) Appl. No.: 16/334,275

(22) PCT Filed: Sep. 29, 2017

(86) PCT No.: PCT/FR2017/052678
§ 371 (c)(1),
(2) Date: Mar. 18, 2019

(87) PCT Pub. No.: WO2018/060656
PCT Pub. Date: Apr. 5, 2018

(65) Prior Publication Data
US 2019/0228919 A1 Jul. 25, 2019

(30) Foreign Application Priority Data

Sep. 29, 2016 (FR) ...................................... 1659322

(51) Int. Cl.
*H01G 11/56* (2013.01)
*H01L 45/00* (2006.01)
(Continued)

(52) U.S. Cl.
CPC ............ *H01G 11/56* (2013.01); *C04B 35/462* (2013.01); *H01G 11/14* (2013.01); *H01G 11/30* (2013.01);
(Continued)

(58) Field of Classification Search
CPC ........ H01G 11/54; H01G 11/56; H01G 11/58; H01G 9/15; H01G 9/025; H01G 11/30;
(Continued)

(56) References Cited

U.S. PATENT DOCUMENTS 5,161,094 A   11/1992  Bruder et al.
2006/0221555 A1  10/2006  Pinnow
(Continued)

FOREIGN PATENT DOCUMENTS

EP   0208589 A1   1/1987
EP   1753045 A1   2/2007
(Continued)

OTHER PUBLICATIONS

International Search Report Application No. PCT/FR2017/052678; dated Jan. 10, 2018.
Japanese Office Action related to Appliation No. 2019-517032.

*Primary Examiner* — Arun Ramaswamy
(74) *Attorney, Agent, or Firm* — von Briesen & Roper, s.c.

(57) ABSTRACT

The invention relates to a supercapacitor comprising:
an electrolyte having a first end and a second end opposite the first end,
(Continued)

a first electrode in contact with the first end of the electrolyte, and
a second electrode in contact with the second end of the electrolyte.
In particular, the electrolyte is made of a solid material that is ion-conductive and electronically insulating.

17 Claims, 7 Drawing Sheets

(51) Int. Cl.
*H01G 11/14* (2013.01)
*H01G 11/84* (2013.01)
*C04B 35/462* (2006.01)
*H01G 11/30* (2013.01)
*G11C 13/00* (2006.01)
*G11C 13/02* (2006.01)

(52) U.S. Cl.
CPC ............. *H01G 11/84* (2013.01); *H01L 45/08* (2013.01); *H01L 45/147* (2013.01); *C04B 2235/3201* (2013.01); *G11C 13/0009* (2013.01); *G11C 13/02* (2013.01); *Y02E 60/13* (2013.01)

(58) Field of Classification Search
CPC ....... H01G 11/84; C04B 35/462; H01L 45/08; H01L 45/147
USPC ................ 361/502, 503, 504, 523, 525, 526
See application file for complete search history.

(56) References Cited

U.S. PATENT DOCUMENTS

2009/0244812 A1* 10/2009 Rawal .................... H01G 2/06
361/525
2017/0069932 A1* 3/2017 Sweeney ............... H01M 4/131

FOREIGN PATENT DOCUMENTS

| EP | 1892723 | A1 | 2/2008 |
| EP | 1956618 | A1 | 8/2008 |
| EP | 2978004 | A1 | 1/2016 |
| EP | 3059748 | A1 | 8/2016 |
| JP | 2012222059 | A | 11/2012 |
| JP | 2015220106 | A | 12/2015 |
| WO | 2015056558 | A1 | 4/2015 |

* cited by examiner

SUPERCAPACITOR WITH ELECTROLYTE

CROSS-REFERENCE TO RELATED APPLICATION

This Application is a 35 USC § 371 US National Stage filing of International Application No. PCT/FR2017/052678 filed on Sep. 29, 2017, and claims priority under the Paris Convention to French Patent Application No. 1659322 filed on Sep. 29, 2016.

FIELD OF THE DISCLOSURE

The invention relates to the field of capacitor-type electrical or electronic components, in particular for energy or information storage.

It more particularly relates to a supercapacitor.

BACKGROUND OF THE DISCLOSURE

Midway between capacitors fabricated by electrodeposition ("electrolytic") and rechargeable batteries, supercapacitors have the advantage of being faster to charge and discharge than batteries and of providing more storage than electrolytic capacitors.

However, their stored energy density remains three to four times lower than that of batteries. They are therefore used as a complement to batteries.

In comparison to conventional capacitors, supercapacitors have a capacity that is about 10,000 times higher, typically 150 farad/g, hence the name "supercapacitor" or "ultracapacitor".

Supercapacitor applications mainly concern the temporary storage of energy, in particular on board vehicles, trains, buses, cranes, and elevators. They enable recovering energy from braking as well as short-term storage.

Supercapacitors are also used for information storage in Static Random Access Memories, or SRAM.

Among supercapacitors, there is a distinction between double-layer capacitors where the storage is purely electrostatic and pseudocapacitors which have electrochemical storage. There are also hybrid capacitors that bring both effects into play.

Double-layer electrostatic supercapacitors generally use carbon electrodes or their derivatives, and the charge separation occurs across a very small thickness (a few angstroms) in a double layer called the Helmholtz layer at the interface with the electrode. Apart from this double layer, the electrolyte conducts the electric current ionically and thus forms a kind of virtual electrode.

In general, a supercapacitor comprises an electrolyte which contains a separation membrane and is connected to two electrodes on each side of the membrane. Under the effect of an electric field applied between the electrodes, Helmholtz double layers of opposite polarity are created on their surface. The electrolyte charges concentrate at the electrode, which provides a greatly reduced distance between the charges of the electrode and the charges of the electrolyte, and therefore a high interface capacitance. As the electrolyte is partially conductive, the central portion of the electrolyte is not involved in the serial assembly of capacities formed by the double layers at the electrodes.

This phenomenon gives rise to a purely electrostatic capacity. In addition, for some materials, ions can be absorbed by the electrodes. Then a faradaic current is added as well, resulting in an additional pseudocapacitance. This current is not of the same type as the faradaic current of batteries in which a chemical reaction exists. In the case of supercapacitors, the Faraday current is related more to a physical phenomenon (adsorption, intercalation) with charge transfer to the electrode.

The electrodes used are generally carbon electrodes (porous carbon, nanotubes of carbon or even graphene).

An illustrative example of a structure of such a supercapacitor is shown in FIG. 1. This structure comprises:
  the electrolyte, made of a material D, and having a first end and a second end opposite the first end,
  a first electrode E1 in contact with the first end of the electrolyte D, and
  a second electrode E2 in contact with the second end of the electrolyte D.

In particular, the material D is ion-conductive. Thus, when a voltage V is applied to it (for example using a source S), there occurs a migration of ions from the material of the electrolyte (for example ions denoted AN—as an example in FIG. 1) towards the electrode of opposite polarity (the positively charged electrode E1 in the example of FIG. 1). Conversely, at the other electrode E2, the material is positively charged, ultimately in the manner of a simple "macro-dipole".

Details of how this type of device operates are described in particular in U.S. Pat. No. 6,671,166.

In that document, the electrolyte material is a liquid, which may cause problems in the fabrication and packaging of supercapacitors comprising such a liquid electrolyte solution, in particular for memory fabrication applications. In addition, although the capacitance obtained is much higher than that of conventional capacitors due to the small thickness of the double layers, it remains limited by the total amount of charges that can accumulate in the double layers.

The present invention improves the situation.

SUMMARY OF THE DISCLOSURE

For this purpose, it proposes a device comprising at least one supercapacitor comprising:
  an electrolyte having a first end and a second end opposite the first end,
  a first electrode in contact with the first end of the electrolyte, and
  a second electrode in contact with the second end of the electrolyte.

According to a general definition of the invention, the electrolyte is made of a solid, inorganic, ion-conductive material having an ionic conductivity that is greater than its electronic conductivity.

Thus, the present invention overcomes the bias which believes that the use of an inorganic solid electrolyte would not permit the fabrication of a supercapacitor of satisfactory performance because said supercapacitor would be dominated by resistive losses. This is actually not the case, as detailed below, when one has an electronically-insulated ionic conductor which consequently possesses a very high dielectric constant. Indeed, the ionic conductors previously considered for supercapacitors, such as $RbAg_4I_5$ as described in "*Electrochemical Energy Storage for Renewable Sources and Grid Balancing*", edited by Patrick T. Moseley, Jürgen Garche (p. 374), have very low dielectric constants of around 10, which is not much better than the constants of dielectrics in conventional capacitors.

Still within the meaning of the invention, the material chosen for the electrolyte is crystalline. "Crystalline" is then understood to mean a material that is monocrystalline, or resulting from an aggregate of monocrystals, or resulting from an aggregate of crystalline grains (their size being nanometric or even up to a few hundred microns, obtained for example by sintering a crystalline powder). More particularly, this crystalline material has a lamellar crystallographic structure having atomic planes that are parallel to each other, ions of the material being able to move between them, thus constituting the ionic conductivity of the material.

The term "lamellar" is understood to mean that the structure has a type of plane of atoms perpendicularly to a crystallographic direction, while this type of planes is not found in the material perpendicularly to the other two spatial directions. In possible materials for the electrolyte, presented below, this lamellar structure may even have a sheet-like mechanical structure, possibly even exfoliable.

It has in fact been observed that the ionic displacement making it possible to increase the ion charge density facing electrode E1 in the example of FIG. 1, could in particular concern ions present on the surface of the parallel planes of the material. In exemplary materials with atomic planes comprising oxygen (such as $A_xB_2O_5$ presented below), it has been found that these mobile ions are $O^{2-}$ oxygen anions.

Preferably, the aforesaid planes are parallel to a defined direction between the first and second ends (horizontal, between the first and second electrodes, in the example of FIG. 1).

A family of candidate materials having such planes of oxygen atoms may be of the $A_2B_2O_5$ type, with:
  A comprising hydrogen and/or an alkali (such as rubidium (Rb) and/or potassium (K)), and
  B comprising titanium (Ti) or a mixture of titanium and another atomic species such as Niobium (Nb) (for example a mixture of 95% Ti and 5% Nb).

As shown below, such a material has unexpected results in terms of the dielectric constant in particular, with relatively low electronic conductivity, which allows advantageous applications particularly for storing data in memory, or for energy storage when using the device as a supercapacitor or even as a pseudo-battery as is shown below.

Alternatively, vanadium bronzes can also be considered.

Preferably, the above planes have vacancies in oxygen sites. Such an embodiment allows oxygen ions to release more easily from their site and travel in the space between said planes before filling a vacancy or accumulating between said planes in order to migrate towards electrode E1. This also allows other ions present in the space between said planes to travel more easily towards electrode E1. Such vacancies can be obtained in particular by thermal annealing, or more generally by a step of "activating" the electrolyte to make it dielectric (highly dielectric compared to materials of the prior art, as discussed below).

Furthermore, at least one of the electrodes (or both electrodes) may be made of carbon, as described above, or of silver, gold, or platinum (to minimize possible oxidation of electrode E1 in particular by the electrolyte). The electrodes may be adhered to the dielectric with carbon or silver lacquer.

As indicated above, the ionic migration in the electrolyte seems to concern primarily (but not solely) $O^{2-}$ oxygen ions. Other types of ions, captured during the annealing phase, may also participate in the ionic migration, in particular hydrogen or hydroxide ions. To avoid disrupting this property, it is preferable to protect the material of the electrolyte from uncontrolled hydration, and in one embodiment the device preferably further comprises an encapsulation of at least the solid material (possibly also the electrodes) in a cell sealed at least against humidity (possibly and more generally airtight).

Particularly in the case of an electrolyte material with atomic planes of oxygen, it appears that moving the planes closer together or further apart facilitates or conversely prevents the migration of charges in the electrolyte. To achieve this result, a stress/relaxation of the planes may be applied by applying a mechanical force, or by changing the temperature, or by another means.

Thus, in one embodiment, the device further comprises at least one mechanical actuator in contact with the solid ion-conductive material, and a control unit for controlling the actuator by applying a control signal, and producing:
  a first force applied in one or more directions of the solid ion-conductive material, corresponding to a state of locking the electric charges in the electrolyte, and
  a second force applied in one or more directions of the solid ion-conductive material, corresponding to a state of releasing the electric charges from the electrolyte, a difference of the first force minus the second force corresponding to a stressing of the atomic planes.

For example and in a non-limiting manner, this force can be applied perpendicularly to the planes of the material, or in a hydrostatic manner on all faces of the material.

For example, the mechanical actuator may comprise a piezoelectric component in contact with the solid ion-conductive material, and the control unit is then configured to control the piezoelectric component by application of an electrical signal.

Such an embodiment may be useful for example in the case where the supercapacitor is utilized in an electrical storage battery, with:
  an unlocked state during the battery charge phases (the braking phases for example of an electric or hybrid vehicle) and the battery discharge phases (retrieval of electric energy stored in the battery), and
  a locked state during a non-use phase of the battery (while the vehicle is off and ignition switch is off, for example).

An example of such an application is described below with reference to FIG. 8.

Alternatively, such an embodiment may be useful for example in the use case where the supercapacitor is utilized in a memory for storing data, in particular binary data, with the possibility of charging or discharging each electrolyte of a set of supercapacitors, then locking the material of the electrolytes (with a local mechanical force, applied by respective micropiezoelectric devices) in order to maintain the respective charge states. Such an arrangement thus enables a "write" mode of the memory. In read mode, a second and different mechanical force is then applied in order to unlock the material and allow it to discharge its charge (or its "no-charge"). Thus, reading the discharge currents allows reading the memory. The same charges as before can then be reapplied. An example of such an application is described below with reference to FIG. 9.

Additionally or alternatively to an applied mechanical force, as indicated above, an increase/decrease of temperature may be provided. Thus, the device of the invention may further comprise at least one member for adjusting the temperature of the solid ion-conductive material, and a control unit for controlling the temperature adjusting member by applying a control signal, and:
  bringing the temperature of the solid ion-conductive material to a first temperature, in order to maintain the solid ion-conductive material in a state of locking the electric charge in the electrolyte, or bringing the temperature of the solid ion-conductive material to a second temperature, in order to maintain the solid ion-conductive material in a state of releasing the electric charge from the electrolyte, the first temperature being higher than the second temperature.

The temperature adjusting member may be for example (but is not limited to) a laser emitting diode focused on the electrolyte or a heating resistor in contact with the material or a Peltier module.

According to tests performed on a material of the $A_2B_2O_5$ type defined above, the first temperature is for example on the order of or greater than 60° C. and the second temperature is around room temperature, typically 20° C. Note that thermal locking also has an advantage in terms of safety in comparison to conventional batteries which have a known risk of explosion due to thermal runaway, since any abnormal rise in temperature of the material automatically cuts off the delivery of current and puts an immediate end to thermal runaway.

In an application of the device where it is configured as a battery (for storing or discharging an electric charge respectively into or from the electrolyte), it is advantageous for the solid ion-conductive material to comprise microcrystals (in particular for trapping charges in grain boundaries and thus multiplying the charges stored).

One of the properties of the electrolyte material, in particular for the case of a material with atomic planes of oxygen (for example $A_2B_2O_5$ defined above), and resulting from the properties of locking/releasing ions in the material, is that the material has variable resistivity as a function of an electrical signal previously applied to it. This feature is shown in FIG. 10, with a form of hysteresis of the resistance of the material (the slope of lines V(I)) as a function of the voltage (or more generally of an electrical signal) applied thereto. Thus, this property opens the way for the direct application of such a supercapacitor for storing data in memory. Such an embodiment is described below with reference to FIG. 1I.

In such an application, the device is therefore configured as memory for storing data, with:

a write mode in which a signal value, selected from at least two values, is applied to the electrolyte, and a read mode in which an electrical resistance of the electrolyte is measured in order to determine the signal value previously applied in write mode.

As indicated above, one simply needs to "activate" the material of the electrolyte in order to impart the properties described above, and in particular its possibility of ion migration. The present invention therefore further provides a method for fabricating a device with supercapacitor as defined above, and in particular comprising this step of activating the material of the electrolyte.

In a first embodiment, the activation step may comprise thermal annealing, preferably in an inert atmosphere (in vacuum or an atmosphere of a neutral gas such as helium, argon, or nitrogen) at a temperature of about 400° K.

Additionally or alternatively, the activation step may comprise soaking the solid material in water. It has also been observed that this simple method allows effective activation of the material.

Additionally or alternatively, the activation step may comprise the application of a high voltage, for example greater than 5 kV/m and preferably about 10 kV/m for example.

BRIEF DESCRIPTION OF THE DRAWINGS

Other features and advantages of the invention will be apparent from reading the following detailed description of some exemplary embodiments and from examining the appended drawings in which.

DETAILED DESCRIPTION OF THE DISCLOSURE

Figure 1:
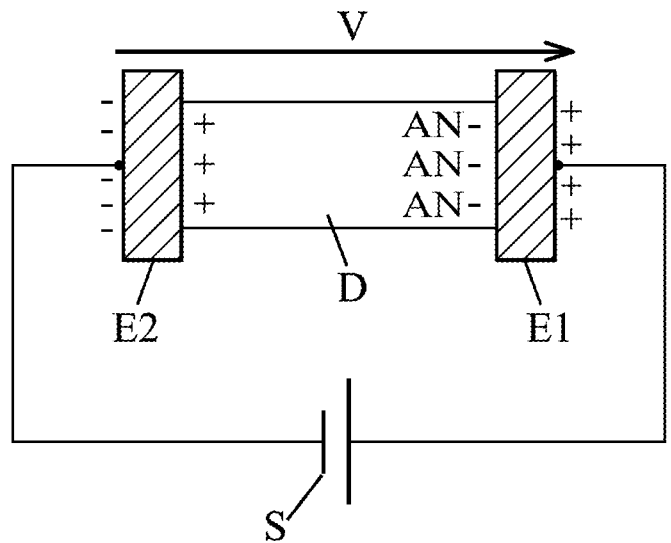
FIG. 1 shows a structure of a device with supercapacitor as presented above.
Figure 2:
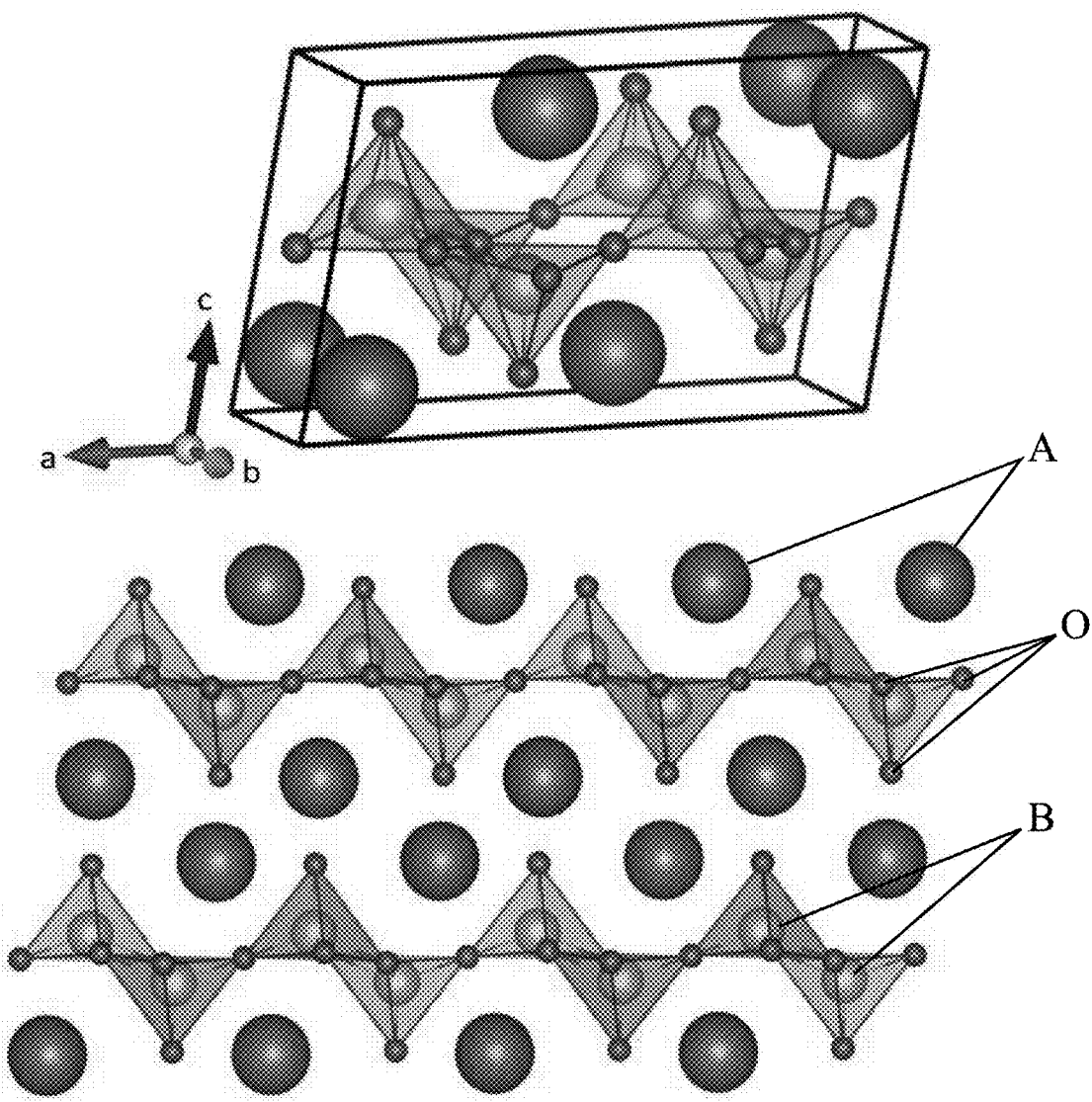
FIG. 2 shows the crystal structure of a material suitable as an example for the electrolyte of a device according to the invention.

As indicated above, the material D of the electrolyte of the supercapacitor illustrated in FIG. 1 is an ion-conductive and electronically insulating solid. A material of this type and having in particular atomic planes of oxygen conducive to ion migration is illustrated in FIG. 2 by way of example. In the example shown, it is a crystal of the chemical formula $M_2Ti_2O_5$, where M is hydrogen and/or an alkali for example such as Rb, K, Cs, etc. The crystal structure of FIG. 2 is C2/m. Thus, titanium here has a coordination number of 5 (in contrast to a stoichiometric perovskite where it would have a coordination number of 6). Such a material advantageously has a lamellar structure (more particularly lamellar titanates in this embodiment) with planes $(Ti_2O_5)^2$ separated by M$^+$ ions.

In the examples presented below, the material of the electrolyte is more particularly $Rb_2Ti_2O_5$, but similar properties have also been observed for $K_2Ti_2O_5$. The structure of the compound in atomic planes of oxygen bound to another species (here titanium) separated by an atom of yet another species (hydrogen, or an alkali, or other) has contributed to the properties described below. An alternative to this material is more generally $M_2Ti_2C_5$, where C is sulfur (S) or comprises a mixture of sulfur and oxygen. Another alternative material with parallel planes which ions travel between is the family of vanadium bronzes of formula $M_xV_2O_5$, where M is a compound among Al, Li, Zn, Ni, Na, Ag, $H_3O$, K, Ba or Cs. These materials can have interesting ionic and electronic properties within the context of the invention.

It has been observed, in $Rb_2Ti_2O_5$ in particular, that this material allows a dielectric constant beyond all expectation (on the order of $10^8$ for the relative dielectric constant) at low frequency (0.01 Hz) and between −80° C. and 80° C. Here, the frequency is relative to a possible alternative voltage applied to the electrolyte, and it has been observed that the dielectric constant decreases with the frequency. Indeed, at low frequency this dielectric constant is associated with ionic movement (probably oxygen ions, as shown below) which move either under the effect of an electric field, or under the effect of diffusion within the material. The ionic conductivity is about $10^{-4}$ to $10^{-3}$ S·cm$^{-1}$. These ions are able to accumulate at the ends of the electrolyte, as shown in FIG. 1, under the effect of an applied electric field. They then create a macro-dipole which gives ferroelectric properties to the material with a much higher polarization than that of conventional electrolytic materials, on the order of 0.1 C·cm$^2$. For comparison, an electric field of 50 GV/mm in polyethylene (polymer usually used as a dielectric material) would be required in order to achieve the same polarization, which is more than 300,000 times the breakdown field of polyethylene. Again for comparison, using an equivalent dielectric constant of $10^8$, the energy density stored in the material is 568 J/cm$^3$, or 160 mAh/cm$^3$, which is much higher than the energy densities stored in conventional supercapacitors.

Figure 3:
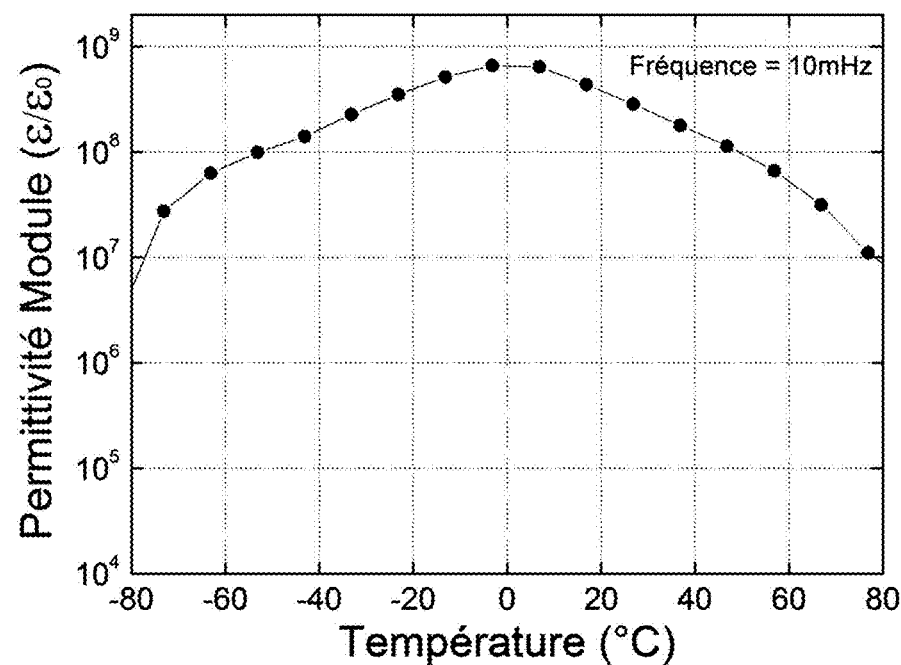
FIG. 3 illustrates the modulus of the complex permittivity (real part and imaginary part) at very low frequency (here 0.01 Hz), corresponding in practice to the dielectric constant of the electrolyte material, as a function of the temperature (abscissa)
Figure 4:
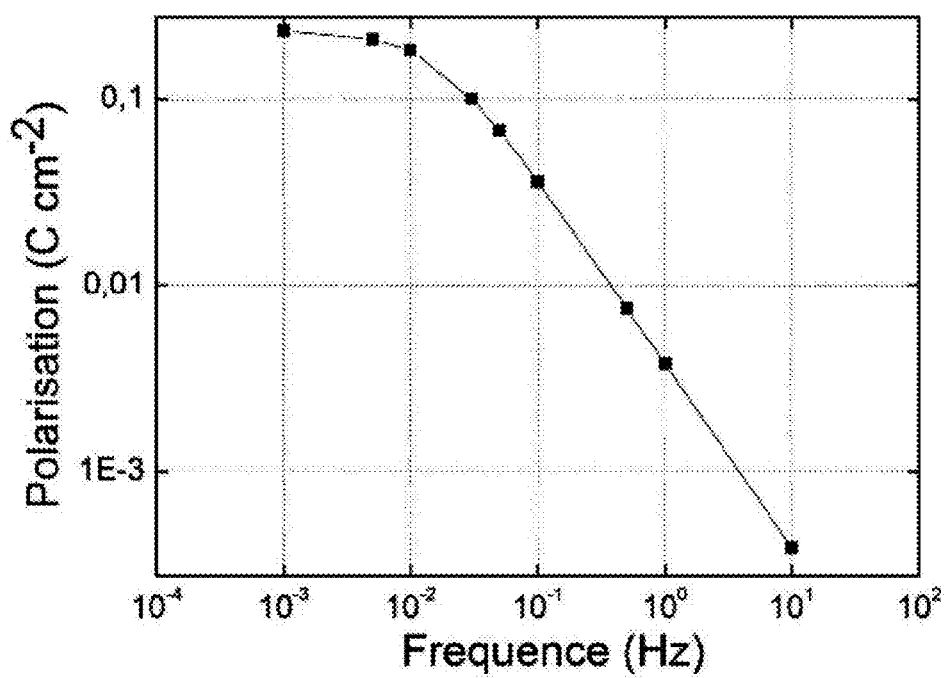
FIG. 4 shows the polarization density of the electrolyte material as a function of the frequency of an applied electric signal, at room temperature, FIG. 5 schematically illustrates the steps of a method for fabricating a device according to one embodiment of the invention.

The dielectric constant is very low outside this temperature range, as shown in FIG. 3. This material is thus a prime candidate for applications around room temperature, between 80 and +80° C. For other applications (space or other), another material of similar composition but different formula can be also considered. FIG. 4 shows the performance of the material as a function of the frequency of the electrical excitation. It is apparent that this material is advantageous for operating in particular in voltages or direct currents (DC), which is fully compatible with applications for storing data in memory or for storing electrical energy in batteries.

When the ions are accumulated at one end and the polarization electric field is cut, a current of opposite sign to the applied voltage is fed to an external circuit thereby retrieving the electric energy (in the form of current and/or voltage). Although the mobility of ions in the material at room temperature is relatively high, about $10^{-6}$ cm·s$^{-1}$·V$^{-1}$, the diffusion constant remains fairly low (about $10^{-14}$ cm$^2$·s$^{-1}$) and the internal electronic conductivity is completely negligible. Thus, the electrons cannot screen the accumulation of ions and the very significant polarization that these ions produce is fully available. The current retrieved from the electrolyte in the aforementioned external circuit is essentially a "displacement current", possibly also with a faradaic component of the current. Observing a very high polarization of the material implies that the transfer of charges at the interface is negligible.

It is then possible to implement a supercapacitor based on a solid ion-conductive material that is electronically insulating, for example of the type shown in FIG. 2, such as $M_2Ti_2O_5$, using the ionic movement within the material. To this end, it may be arranged to use crystals or monocrystals directly, or appropriate sintered nanocrystals or microcrystals based on these materials, and to place them between two conductive electrodes.

The material present in the device may therefore be monocrystalline or polycrystalline in form. In the monocrystalline form, the electrodes can simply be placed in contact with a monocrystal of $M_2Ti_2O_5$, using silver paint or carbon glue.

Figure 5:
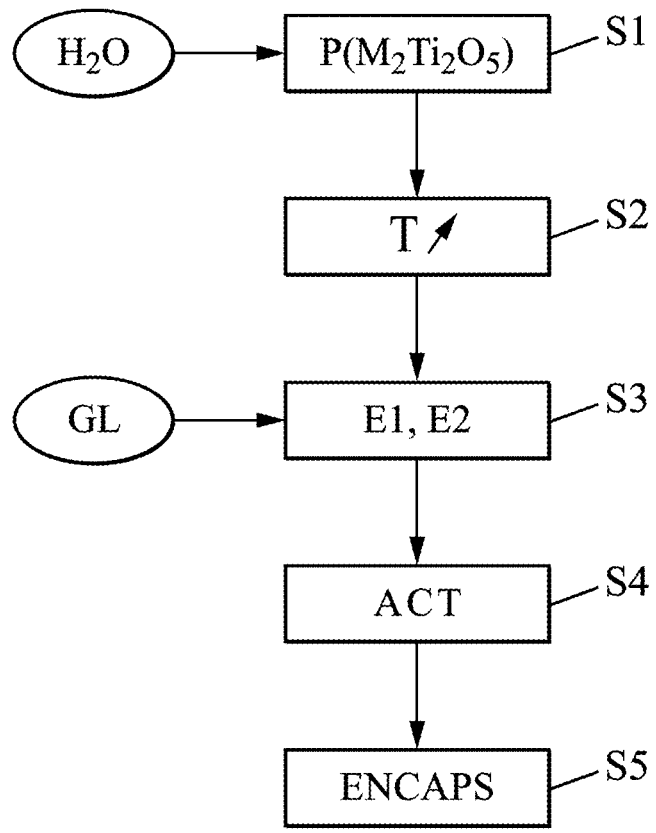

Referring to FIG. 5, illustrating the method for fabricating a polycrystal-based supercapacitor, a given amount of water is added in step S1 to a collection of crystals or microcrystals of $M_2Ti_2O_5$ in powder form. In step S2, the mixture may be compressed into a pellet shape. For example, step S2 may consist of placing the mixture in an oven at 400° K. for 20 minutes in order to solidify the whole by evaporating the water. Then, in an exemplary embodiment, in step S3 the electrodes are placed in contact with this pellet using a glue such as silver paint or carbon glue. Alternatively, the aqueous mixture may be encapsulated between the two electrodes and the whole may be compressed in an annealing oven. In addition, it is also possible to dispense with the glue and/or lacquer by exerting mechanical stress to ensure contact between the material and the electrodes.

The electrodes may be made of carbon, or of copper, of gold, of silver, of platinum for example. Furthermore, one electrode may be made of a different material than the other, for the requirements of a specific application.

Next, a step S4 of "activating" the material of the electrolyte to render it ion-conductive is implemented. Indeed, prior to any use, it is necessary to "activate the material" by at least one or more of the following steps:
  annealing the material in an atmosphere low in oxygen for several hours
  applying strong electric fields to it (typically around 10 kV/m or more) for several hours at room temperature,
  hydrating it with a certain amount of water.

It can be advantageous to implement the hydration step in the case of a powder of microcrystals to be sintered, since it allows both activating the material and fabricating the electrolyte. One can then anneal the mixture in an oven under an ambient atmosphere at 400° K as discussed above.

In step S5, as materials of the type shown in FIG. 2 are highly hygroscopic, it is arranged to maintain the electrolyte under an anhydrous atmosphere to the extent possible, and for this purpose to protect it from humidity in particular by a fluidtight encapsulation, in order to avoid altering its properties.

In addition, among the properties of the material (particularly $M_2Ti_2O_5$), the possibility has been observed of retrieving a spontaneous current opposite in sign to the charge voltage applied, and doing so:
  immediately after voltage interruption (under "normal" conditions of use), or
  after a period which follows the voltage interruption, under "special" conditions in which ions are locked within the material, preventing them from relaxing.

At least two techniques of "locking" charges within the material may be implemented.

Figure 6:
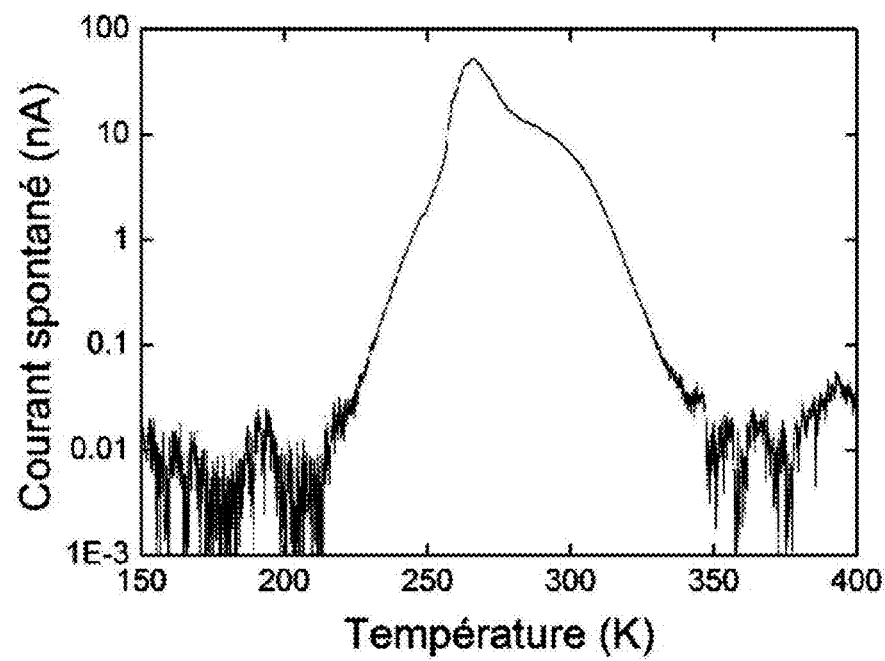
FIG. 6 shows the spontaneous current emitted by a sample of the electrolyte material of FIG. 2, as a function of the applied temperature, the sample here having a thickness of 1 mm and cross-sectional area of $4 \times 10^{-8}$ m$^2$, and having been previously activated and charged, FIG. 6 thus illustrating the mechanism of "locking" the charge by temperature.

In a first embodiment, the temperature is raised locally in the material by several tens of degrees (for example up to 60° C.). The spontaneous current is then seen to cease, as shown in FIG. 6. The current is restored spontaneously when the temperature returns to room temperature, without requiring any other charge process. The local increase in temperature may be produced by various means, for example by laser, radiofrequency, or resistive heating, or by Peltier module.

In a second embodiment, alternatively or in combination, it is possible to vary appropriately the pressure load on the material in order to "lock" any discharge and maintain the charge in the electrolyte, by applying a mechanical force. Then, the application of a different force (for example a "null" force with release of the pressure) allows releasing the charge from the electrolyte and thus retrieving the current that was stored therein. The mechanical force may be applied by mechanical, piezoelectric, electrostrictive, magnetostrictive, or magneto-mechanical systems for example.

Supercapacitors based on a solid ion-conductive material, particularly of the $M_2Ti_3O_5$ type, have charge storage densities that exceed the performance of existing supercapacitor devices because of the very high dielectric constant and therefore the very strong polarization induced in the material (typically 0.1 $C/cm^2$), for a low electron conduction.

Figure 7:
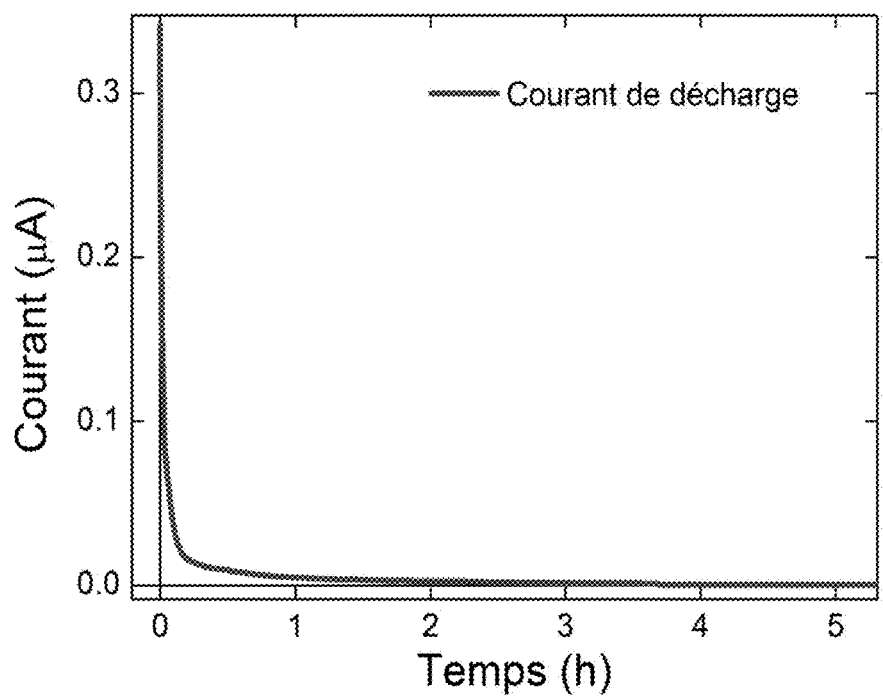
FIG. 7 illustrates the instantaneous relaxation of the current after a 30 minute charge of the electrolyte material, measured on the above sample, FIG. 8 schematically illustrates a device according to the invention, in an application as a battery, FIG. 9 schematically illustrates a device according to the invention, in an application as piezoelectric memory PZ.

Unless the charges of the electrolyte material are "locked", the discharge time is initially relatively fast, a few minutes, then relatively slow, a few hours, as shown in FIG. 7. One advantageous application is to provide such a supercapacitor as a battery, as presented below with reference to FIG. 8.

Figure 8:
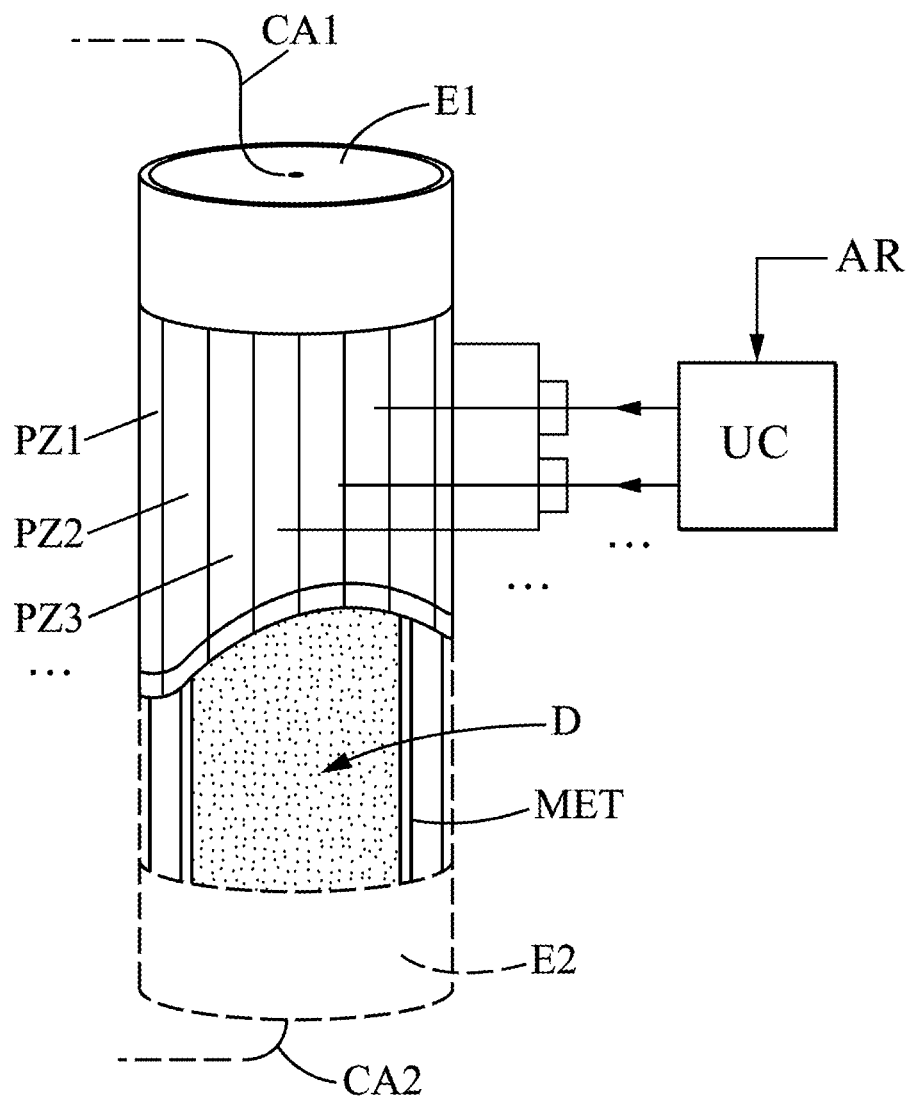

In FIG. 8, the material D of the electrolyte is preferably in polycrystalline form in order to accumulate charges in the grain boundaries during the charging phases. The material D is further encapsulated in a waterproof membrane MET (anhydride) and the electrodes E1 and E2 are joined to it. The electrodes E1 and E2 are connected to cables CA1, CA2 for charging and discharging the battery. In addition, the electrolyte is surrounded by a jacket of piezoelectric members PZ1, PZ2, PZ3 . . . which can be controlled by one or more electrical signals from a control unit UC, in order to apply to the material D a specific force for locking charges in the electrolyte, in a lasting manner, for example after receiving at the control unit CU a shutoff signal AR from a motor vehicle in which the battery is implemented.

Figure 9:
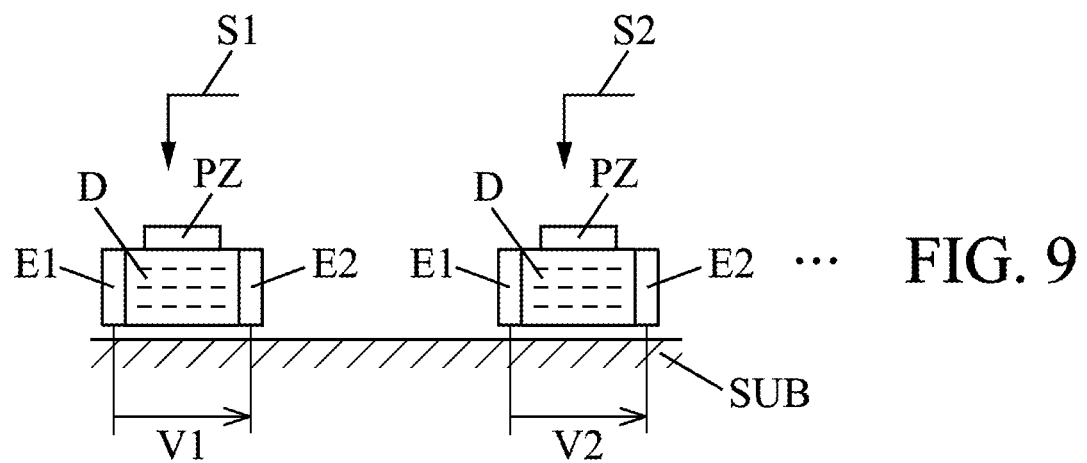

Represented in FIG. 9 is another application in which the device of the invention comprises a plurality of supercapacitors arranged in series, each of the supercapacitors comprising:
- an electrolyte comprising the solid electronically-insulating ion-conductive material D (for example in the form of a monocrystal of the type shown in FIG. 2, with horizontal atomic planes of oxygen as represented by dotted lines in FIG. 9),
- two electrodes E1 and E2 one on each side of the material D, for sending a charge or "no-charge" signal V1, V2 for each supercapacitor, in write mode,
- a piezoelectric member PZ arranged to apply a variable mechanical force on the electrolyte, and controlled by an electric signal S1, S2, to guide a write mode or a read mode for the memory.

The supercapacitors may rest on a substrate SUB containing appropriate contacts for connecting the electrodes E1 and E2. In an exemplary design, a thin film of solid ion-conductive material D may be deposited on the substrate SUB, on which contacts have been previously arranged in order to form the electrodes E1 and E2. Then, by etching, electrolyte members are isolated from each other to form a set of supercapacitors.

Thus, in write mode, a charge or "no-charge" signal V1 can be applied to a supercapacitor, then the piezoelectric member PZ is controlled by signal S1 to apply a force to the electrolyte material so that it is then locked, with the charge or "no-charge" that it has accumulated.

Then, in read mode, another signal S2 is applied to the piezoelectric member PZ (for example to release the stress that it (PZ) is applying to the material D of the electrolyte). In this case, the electrolyte discharges, and a corresponding electrical signal can be measured across the electrodes E1 and E2. In particular, if zero charge is measured in this step, which simply means that the electrolyte had not been previously charged, a binary value for example 0 can be associated with such a measurement. In contrast, if a charge in excess of a threshold is measured in this step, which means that the electrolyte had indeed been previously charged, a binary value, for example 1, can be associated with this measurement.

Figure 10:
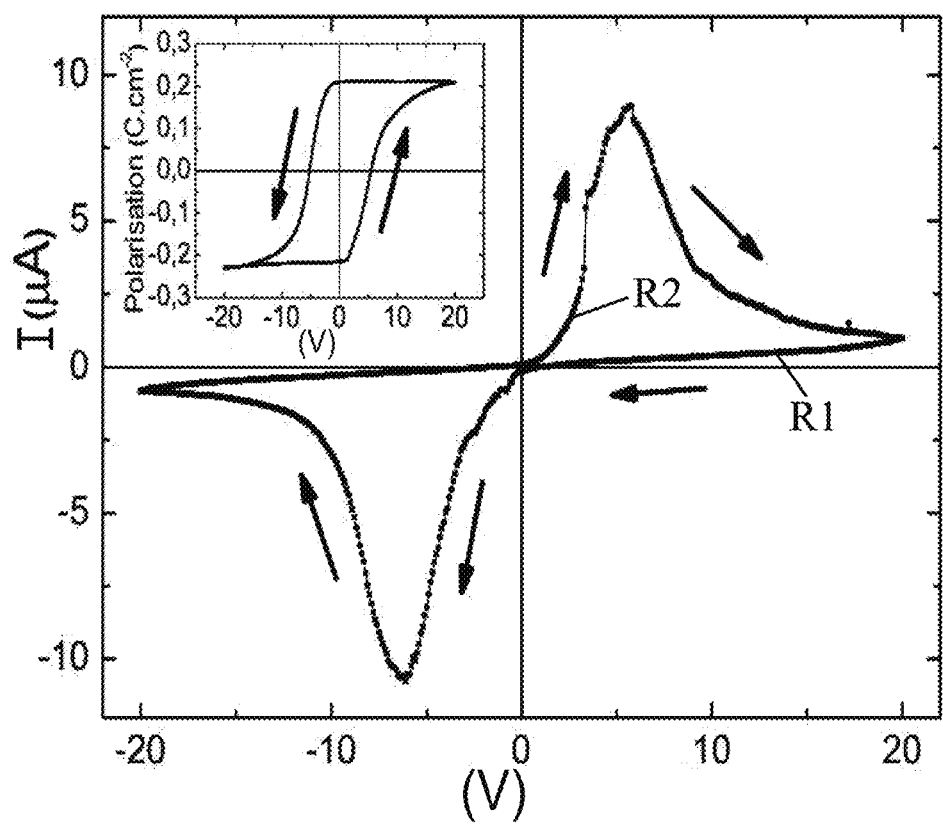
FIG. 10 shows the variation in resistivity of the electrolyte material as a function of a voltage previously applied thereto, FIG. 11 schematically illustrates a device according to the invention, in an application as a memory based on the principle illustrated in FIG. 10.

Another exploitable property has been observed in a solid, electronically-isolating, ion-conductive electrolyte material, in particular of the type shown in FIG. 2. It is possible to measure for example a different resistivity in the material, as a function of the voltage applied to it. This property, known as "memristance," is illustrated by FIG. 10 which shows that the slopes V(I) of the material (and therefore of its resistance, or more generally its resistivity) depend on the duration and value of the voltage V previously applied to it. An equivalent property is the hysteresis of the polarization of the material as a function of the voltage V. Resulting from this property is an application as presented below with reference to FIG. 11, again for the storage of data in memory.

Figure 11:
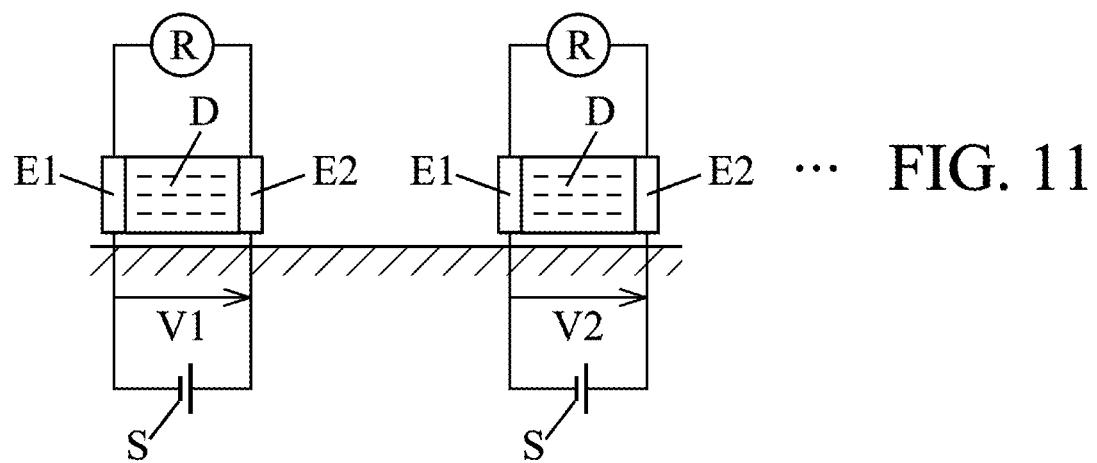

In this embodiment, the supercapacitors are connected to voltage sources S in order to apply respective voltages V1, V2 during a respective duration t1, t2 that are able to "print" a more or less significant slope V(I) as a function of the duration and amplitude of the applied voltage (typically corresponding to a high resistance value for a low voltage V1 and/or a short duration t1, and conversely to a low resistance value for a higher voltage V2 and/or duration t2, as shown in FIG. 11, for positive voltage values). A memory write mode is thus defined. For read mode, the resistance R of each supercapacitor can next be measured (by applying a smaller voltage than V1 so as not to disturb the resistivity of the electrolyte), this measurement thus indicating the value of the voltage V1 or V2 previously applied to the supercapacitor.

Alternatively, the polarization may of course be measured in order to determine the voltage previously applied.

More generally, the present invention is not limited to the embodiments described above as examples; it extends to other variants.

Thus, more generally, applications other than those presented above may be considered.

Furthermore, a material $M_2Ti_2O_5$ has been described herein as a reference, with M being alkali (or hydrogen). However, other candidate materials are possible among those with atomic planes of oxygen, but possibly also among those with other mobile atomic species arranged in planes, or more generally any type of solid material (other than polymer and preferably with high ionic conductivity and low electronic conductivity).

The invention claimed is:

1. A device comprising at least one supercapacitor comprising:
   an electrolyte having a first end and a second end opposite the first end,
   a first electrode in contact with the first end of the electrolyte, and
   a second electrode in contact with the second end of the electrolyte,
   wherein the electrolyte is made of a solid, inorganic, ion-conductive material having an ionic conductivity that is greater than its electronic conductivity, and wherein the solid material is crystalline and has a lamellar crystallographic structure formed of planes having a composition of the type of $A_2B_2O_5$ and parallel to each other, ions of the material being able to move between said parallel planes, constituting said ionic conductivity of the material.

2. The device according to claim 1, wherein said planes are parallel to a defined direction between the first and second ends.

3. The device according to claim 1, wherein element A comprises hydrogen.

4. The device according to claim 1, wherein element A comprises an alkali.

5. The device according to claim 4, wherein the alkali comprises at least one element among rubidium and potassium.

6. The device according to claim 1, wherein element B comprises titanium.

7. The device according to claim 6, wherein element B comprises a mixture of titanium and niobium.

8. The device according to claim 1, wherein said planes have vacancies in oxygen sites.

9. The device according to claim 1, wherein it further comprises encapsulation of at least the solid material, in a cell sealed against at least humidity.

10. The device according to claim 1, further comprising at least one mechanical actuator in contact with the solid ion-conductive material, and a control unit for controlling the actuator by applying a control signal, and producing:
   a first force applied to the solid ion-conductive material, corresponding to a state of locking the electric charges in the electrolyte, and
   a second force applied to the solid ion-conductive material, corresponding to a state of releasing the electric charges from the electrolyte, a difference of the first force minus the second force corresponding to a stressing of the atomic planes of the material.

11. The device according to claim 10, wherein the mechanical actuator comprises a piezoelectric component in contact with the solid ion-conductive material, and wherein the control unit is configured to control the piezoelectric component by application of an electrical signal.

12. The device according to claim 1, further comprising at least one member for adjusting the temperature of the solid ion-conductive material, and a control unit for controlling the temperature adjusting member by applying a control signal, and:
   bringing the temperature of the solid ion-conductive material to a first temperature, in order to maintain the solid ion-conductive material in a state of locking the electric charge in the electrolyte, or
   bringing the temperature of the solid ion-conductive material to a second temperature, in order to maintain the solid ion-conductive material in a state of releasing electric charge from the electrolyte, the first temperature being higher than the second temperature.

13. The device according to claim 1, wherein the solid ion-conductive material has variable resistivity as a function of an electrical signal previously applied to the solid ion-conductive material,
and wherein the device is configured as memory for storing data, with:
   a write mode in which a signal value, selected from at least two values, is applied to the electrolyte for at least a predetermined duration, and
   a read mode in which an electrical resistance of the electrolyte is measured in order to determine the signal value previously applied in write mode.

14. A method for fabricating a device with a supercapacitor, said supercapacitor comprising:
   an electrolyte having a first end and a second end opposite the first end,
   a first electrode in contact with the first end of the electrolyte, and
   a second electrode in contact with the second end of the electrolyte,
      the electrolyte being made of a solid, inorganic, ion-conductive material having an ionic conductivity that is greater than its electronic conductivity,
and the solid material being crystalline with a lamellar crystallographic structure formed of planes having a composition of the type of $A_2B_2O_5$ and parallel to each other, ions of the material being able to move between said parallel planes, constituting said ionic conductivity of the material, the method comprising a step of activating the material of the electrolyte.

15. The method according to claim 14, wherein the activation step comprises thermal annealing in an inert atmosphere at a temperature of about 400K.

16. The method according to claim 14, wherein the activation step comprises soaking the solid material in water.

17. The method according to claim 14, wherein the activation step comprises the application of a voltage greater than 5 kV/m.

* * * * *